United States Patent [19]
Hanaoka et al.

[11] Patent Number: 6,144,046
[45] Date of Patent: *Nov. 7, 2000

[54] POWER INVERTER HAVING SERIES CONNECTION OF SEMICONDUCTOR DEVICES EACH HAVING AN INVERSE PARALLEL CONNECTION OF AN INSULATED GATE BIPOLAR TRANSISTOR AND A DIODE

[75] Inventors: Koumei Hanaoka; Naoki Sakurai, both of Hitachi; Mutsuhiro Mori, Mito, all of Japan

[73] Assignee: Hitachi, Ltd., Tokyo, Japan

[ * ] Notice: This patent is subject to a terminal disclaimer.

[21] Appl. No.: 08/902,332

[22] Filed: Jul. 29, 1997

Related U.S. Application Data

[62] Division of application No. 08/391,568, Feb. 21, 1995, Pat. No. 5,701,018.

[30] Foreign Application Priority Data

Feb. 18, 1994 [JP] Japan ............................. 6-20841

[51] Int. Cl.[7] .................. H01L 29/74; H01L 31/111; H01L 29/76; H02H 7/122
[52] U.S. Cl. .................. 257/140; 257/146; 257/104; 257/378; 363/56
[58] Field of Search .................. 257/329, 140, 257/146, 104, 378, 132, 133, 139, 147, 155, 106, 212; 363/56

[56] References Cited

U.S. PATENT DOCUMENTS 5,274,541 12/1993 Kimura et al. ............................. 363/56
5,701,018 12/1997 Hanaoka et al. ......................... 257/140

*Primary Examiner*—Steven H. Loke
*Attorney, Agent, or Firm*—Antonelli, Terry, Stout & Kraus, LLP

[57] ABSTRACT

An inverter apparatus constituted by one or more series connections of plural semiconductor devices each having a pair consisting of an insulated gate bipolar transistor, and a diode, both of which are in a reverse parallel connection with each other, wherein the resistivity of the base layer of the lowest impurity concentration in the diode is lower than that of the base layer of the lowest impurity concentration in the insulated gate bipolar transistor, and wherein a breakdown voltage of said insulated gate bipolar transistor at the time of switching from a conduction state to a blocking state is lower than a breakdown voltage of said insulated gate bipolar transistor and said diode at the time of the blocking state.

22 Claims, 5 Drawing Sheets

6,144,046

POWER INVERTER HAVING SERIES CONNECTION OF SEMICONDUCTOR DEVICES EACH HAVING AN INVERSE PARALLEL CONNECTION OF AN INSULATED GATE BIPOLAR TRANSISTOR AND A DIODE

This is a divisional of application Ser. No. 08/391,568, filed Feb. 21, 1995, now U.S. Pat. No. 5,701,018.

BACKGROUND OF THE INVENTION

This invention relates to a semiconductor device (hereinafter referred to as IGBT module) wherein an insulated gate bipolar transistor and a diode are in a reverse parallel connection or are connected in parallel with each other in the opposite direction.

With development of power electronics, it is important to make an inverter apparatus having a high performance, low noise and a small size.

The insulated gate bipolar transistor (hereinafter referred to as IGBT) is a voltage drive type element with the high speed of a MOSFET and the high output characteristic of a bipolar transistor. The drive circuit of an IGBT can be made smaller as compared with the drive circuit of a bipolar transistor, which is an electric current drive type element.

The typical IGBT is usually used in a form of IGBT module. IGBT modules are semiconductor devices formed in such a manner that an IGBT and a diode, which are in a reverse parallel connection, or are connected in the opposite direction in parallel with each other, are incorporated in a package, and the electrode terminal is taken out to the outside. The IGBT modules are mainly used in inverter circuits, etc.

In order to reduce the loss in an inverter circuit, it is necessary to reduce the loss of the IGBT module. Therefore, in recent years, an improvement has been made in order to reduce the switching loss and the loss due to the ON-state voltage of the IGBT. For example, it is known that a tail electric current is the main cause of switching loss. The tail electric current is an electric current that decreases as the tail is pulled gently, after the collector electric current decreases steeply by turn-off. Reduction of the tail electric current decreases the switching loss. It is known that many cells are integrated in the same area by making the unit cells minute, so that the channel width per unit area is increased to reduce the ON-state voltage. As a loss reduction technique of the IGBT like the above, it is known that the resistivity of the n base layer of the IGBT is increased, as seen in Japanese patent Laid-open print No. 4-133355. As mentioned above, it is possible to reduce the loss of an IGBT by reducing the tail electric current and the ON-state voltage. But, when the improved IGBT, as stated above, is incorporated in IGBT modules, a voltage noise occurs.

SUMMARY OF THE INVENTION

An object of this invention is to provide a semiconductor device having a reduced voltage noise and loss, as well as a higher destruction capability. The semiconductor device comprises a pair consisting of an IGBT and a diode connected in the opposite direction in parallel with each other. The present invention provides a semiconductor device comprising at least a pair consisting of an insulated gate bipolar transistor and a diode, both of which are connected in a reverse parallel direction in parallel with each other, wherein the resistivity of the base layer of the lowest impurity concentration in the diode is lower than that of the base layer of the lowest impurity concentration in the insulated gate bipolar transistor, and wherein the breakdown voltage of said insulated gate bipolar transistor at the time of switching from the conduction state to the blocking state is lower than the breakdown voltage of said insulated gate bipolar transistor and said diode at the time of the blocking state.

Another aspect of the present invention is concerned with a semiconductor device comprising at least a pair of an insulated gate bipolar transistor and a diode, both of which are in a reverse parallel connection in one module, wherein the resistivity of the base layer of the lowest impurity concentration in the diode is lower than that of the base layer of the lowest impurity concentration in the insulated gate bipolar transistor, and wherein the breakdown voltage of the insulated gate bipolar transistor at the time of switching from the conduction state to the blocking state is lower than that of the insulated gate bipolar transistor and that of the diode at the time of the blocking state. In the semiconductor device as mentioned above, the base layer of the lowest impurity concentration in the diode is thicker than the base layer of the lowest impurity concentration in the insulated gate bipolar transistor. In the semiconductor device mentioned above, the base layer in the insulated gate bipolar transistor has a resistivity and thickness such that a depletion layer is formed at about (n/2)volts, but the base layer of said diode has a resistivity and thickness such that the depletion layer is not formed at (n/2)volts when a rated voltage is nV. According to another aspect of the present invention, there is provided a semiconductor device comprising at least a pair consisting of an insulated gate bipolar transistor and a diode, both of which are in a reverse parallel connection, wherein the resistivity of a base layer of the lowest impurity concentration in the insulated gate bipolar transistor is in the range from (n/17) to (n/6)Ω·cm, and the resistivity of a base layer of the lowest concentration in the diode is in the range of (n/25) to (n/17)Ω·cm, wherein the thickness of the base layer of said IGBT is from almost (n/10.5) to (n/7.5) μm, and the thickness of said base layer of said diode is (n/10) μm or more. When the rated voltage is nV, another aspect of the present invention is a semiconductor device having at least a pair consisting of an insulated gate bipolar transistor and a diode has (1) an insulated gate bipolar transistor, comprising:
 a first main surface and a second main surface;
 a first area of a first conductive type, exposed to said first main surface;
 a second area of a second conductive type, adjacent to said first area, having an impurity concentration lower than that of said first area;
 a third area of the second conductive type, adjacent to said second area, having an impurity concentration lower than that of said second area and being exposed to the second main surface;
 a fourth area of the first conductive type, selectively formed in said second main surface having an impurity concentration higher than that of said third area;
 a fifth area of the second conductive type, selectively formed in the second main surface, having an impurity concentration higher than that of said fourth area, an insulated gate formed on the third, fourth and fifth areas through an insulation film; and
 a first main electrode in low ohmic contact with the first area, and a second main electrode which shorts said fourth and fifth areas on the second main surface; and (2) a diode having a one and other main surfaces, comprising:
  a sixth area of the second conductive type, exposed to the first main surface, a seventh area of the second conductive type adjacent to said sixth area, having an impurity concentration lower than that of said sixth area;
  an eighth area of the first conductive type, adjacent to said seventh area, having an impurity concentration which is higher than that of said seventh area and being exposed to said other main surface; and
  a third electrode in low ohmic contact with said sixth area, and a fourth electrode in low ohmic contact with said eighth area;
wherein said first main electrode and said third main electrode are connected to each other, and said second main electrode and said fourth main electrode are connected to each other;
wherein the resistivity of the seventh area in said diode is lower than that of the third area of said insulated gate bipolar transistor; and
wherein the breakdown voltage at the time of switching of said insulated gate bipolar transistor from a conduction state to a blocking state is lower than that of a blocking state of said insulated gate bipolar transistor and of said diode.

As shown in FIG. 2, the structure of an IGBT is formed as follows. The second area 12 is formed so as to adjoin the first area 11. In addition, the third area 13 (collector side base layer) is formed so as to adjoin the second area 12. The fourth area 14 is formed selectively on the surface part of the third area 13. In addition, the fifth area 15 is formed selectively on the surface part in this fourth area 14. The surface part of the fourth area 14 held by the third area 13 and the fifth area 15 is formed as the channel area, and an insulation film 19 is provided at this upper part. In addition, insulation gate 20 is provided at the upper part. A second main electrode 21 is commonly connected to the fourth area 14 and the fifth area 15. A first main electrode 22 is connected to the first area 11.

On the other hand, the structure of the diode is formed as follows. The seventh area (base layer) 17 is formed so as to adjoin the sixth area 16. The eighth area 18 is formed on the surface part of the seventh area 17. A third main electrode 23 is connected to the sixth area 16. A fourth main electrode 24 is connected to the eighth area 18.

Here, the resistivity of the seventh area (base layer) 17 is lower than that of the third area (collector side base layer) 13. Generally, the higher the resistivity is, the wider the depletion layer expands easily. Therefore, upon turn-on of the IGBT, the diode with low resistivity recovers softly, due to the residual carriers of the area to which the depletion layer does not extend, so that the leap voltage is reduced. When the dynamic breakdown voltage at the time of turn on of the IGBT is lower than the static breakdown voltage which occurs when the IGBT and the diode are in the blocking state, an avalanche breakdown takes place in the operating area of the IGBT, so that the leap voltage can be suppressed to a certain constant voltage, thereby to protect the diode from breakdown. Thus, the reliability of the semiconductor device and the breakdown capability thereof can be improved.

DESCRIPTION OF THE PREFERRED EMBODIMENTS

Figure 3:
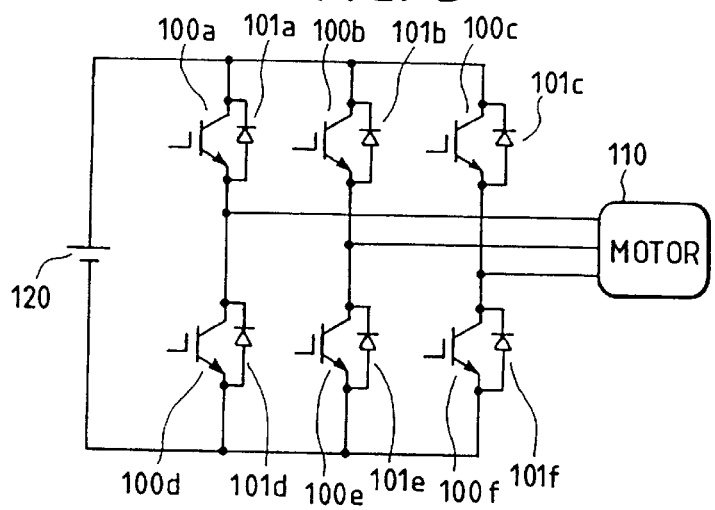
FIG. 3 is a circuit diagram of an inverter using the IGBT modules.

FIG. 3 shows an inverter circuit using IGBT modules. In FIG. 3, 100a to 100f are the IGBTs, 101a to 101f are the diodes, 110 is a motor, and 120 is a power source.

There are various kinds of IGBT modules.

(1) IBGT modules in which only a pair consisting of an IGBT and a diode are incorporated in a package.

(2) IGBT modules which share an upper arm and a lower arm in one phase.

(3) IGBT modules which share the upper arm and the lower arm in the three phases. These are properly used on a case by case basis.

In FIG. 3, when 100a and 100e of the IGBT are turned on, the electric current flows via IGBT 100a—motor 110—IGBT 100e from the power source 120. This time, IGBT 100b and 100d in the other arm and diodes 101b and 101d are in a blocking state, and thus the diode and the IGBT need approximately the same breakdown voltage. When IGBT 100e is turned off, the electric current flowing through the motor flows back via IGBT 100a, motor 110 and diode 101b by the energy of the motor. Again, when IGBT 100e is turned on, the electric current flowing in diode 101b flows back to IGBT 100e.

Figure 4A:
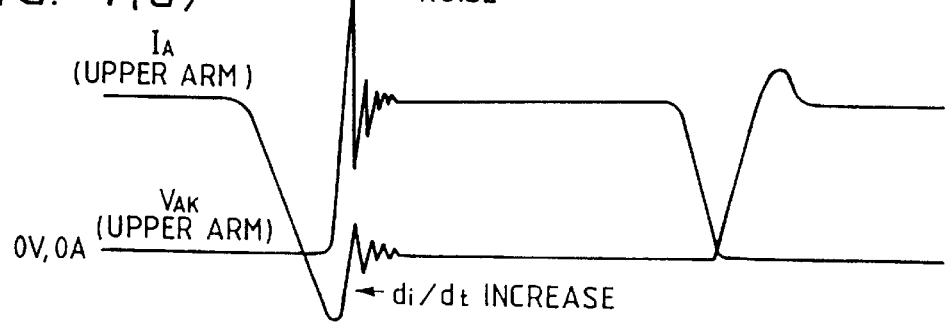
FIGS. 4(a) and 4(b) show switching waveforms of an IGBT module.
Figure 4B:
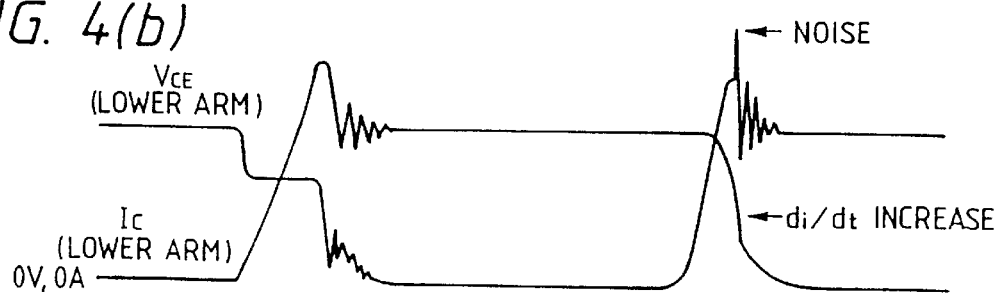
Figure 5:
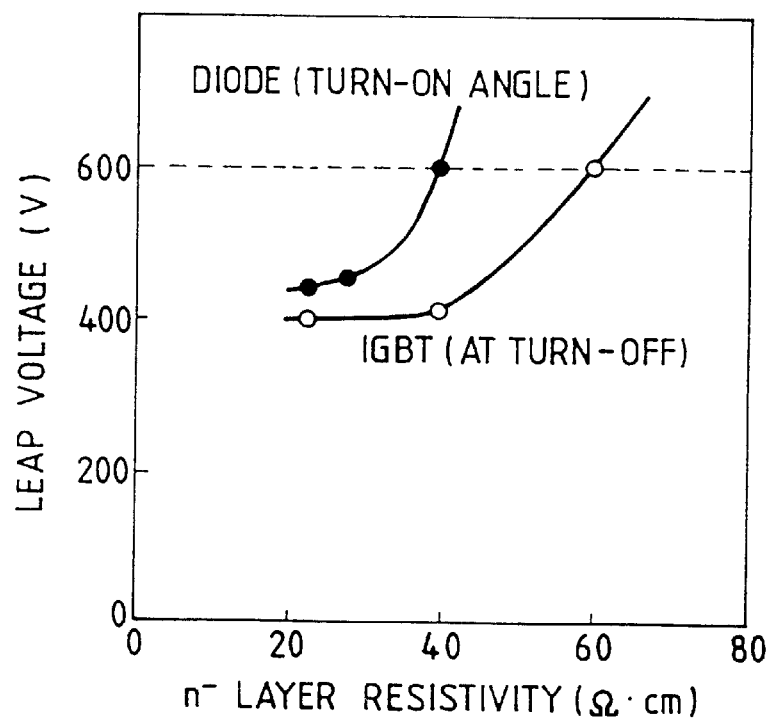
FIG. 5 is a characteristic diagram which shows the change of the leap voltage when the resistivity of the n– layer is changed.

FIGS. 4(a) and 4(b) show the switching waveform in the IGBT modules. In particular, FIG. 4(a) shows the waveforms of an anode electric current I11 of the diode 101b in the upper arm in the circuit diagram of FIG. 3 and of voltage VAK between the anode and the cathode.

FIG. 4(b) shows the waveforms of a collector electric current I11 of IGBT 100e in the lower arm and of voltage VCE between the collector and the emitter. When the IGBT is in the ON state, the electric current that flows in the diode is cut off, and when the IGBT is in the OFF state, the electric current flows in the diode again. As shown in the switching waveforms of FIGS. 4(a) and 4(b), IGBT generates the leap voltage at the time of the turn-off, to produce noise. And, the diode generates the leap voltage likewise upon turning on of the IGBT, and noise is produced again.

The cause of the leap voltage when turning off the IGBT is in the steep decrease of the collector electric current upon turnoff. When a tail electric current is decreased to improve the switching loss, the collector electric current decreases more steeply by turnoff, thereby to increase the electric current changing rate di/dt. Because the wiring has inductance in the IGBT modules, the leap voltage is generated by the electric current changing rate and the wiring inductance. The leap voltage also increases as the electric current changing rate increases, which causes voltage noise.

On the other hand, the noise generated in recovery of the diode is caused by making the unit cell of the IGBT minute. When the unit cell is made minute, to lower the ON-state voltage much more electric current can flow in the same gate voltage. Mutual conductance gm at this time becomes large inevitably. When the IGBT turns on during the inverter operation, and the collector electric current increases, di/dt is proportional to gm. The larger gm is, the larger di/dt becomes. When the gm of the IGBT becomes larger, di/dt at the time of turn-on becomes larger, and the turn-on time becomes shorter, to reduce the turn-on loss. However, when the di/dt of the IGBT becomes large, the di/dt when the diode of the pair arm recovers becomes also large. As a result of the wiring inductance and the increase of di/dt, the leap voltage of the diode increases to generate a noise voltage. The occurrence of the voltage noise deteriorates the element. The voltage noise sometimes causes other arms or IGBT of other phases to operate improperly, thereby lowering the reliability of the IGBT modules and of the inverters, etc.

An example of this invention now will be explained in detail by using the drawings.

Figure 1:
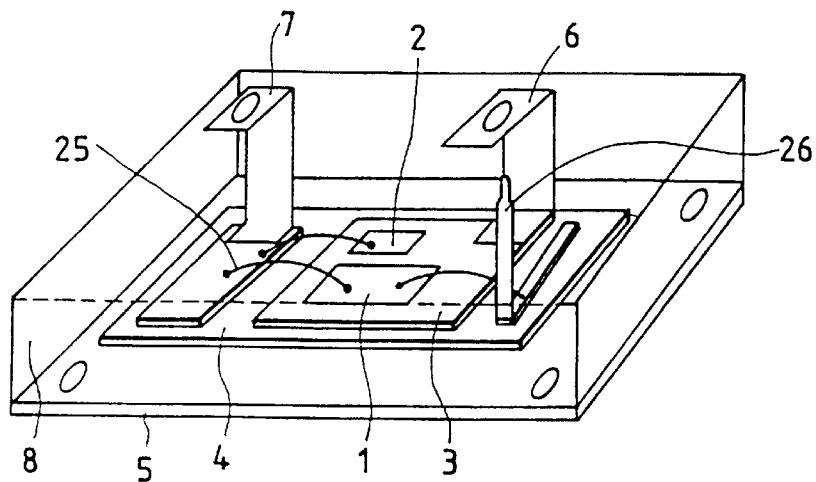
FIG. 1 is a perspective view of an IGBT module to which this invention applied.

FIG. 1 shows a perspective view of an IGBT module to which this invention is applied. An insulating plate 4 is provided on a heat sink board 5 made of metal. A metal board 3 is provided on the insulating plate 4. The IGBT 1 and diode 2 are set on the metal board 3. The collector electrode of the IGBT and the cathode electrode of the diode are connected to a collector terminal 6 through electrode board 3. The emitter electrode of the IGBT and the anode electrode of the diode are connected together by a wiring 25 to an emitter terminal 7, and the gate electrode of the IGBT is connected to a gate terminal 26. The above structure is built in a plastic package 8, and each terminal is taken out to the outside of the plastic package 8.

Figure 2:
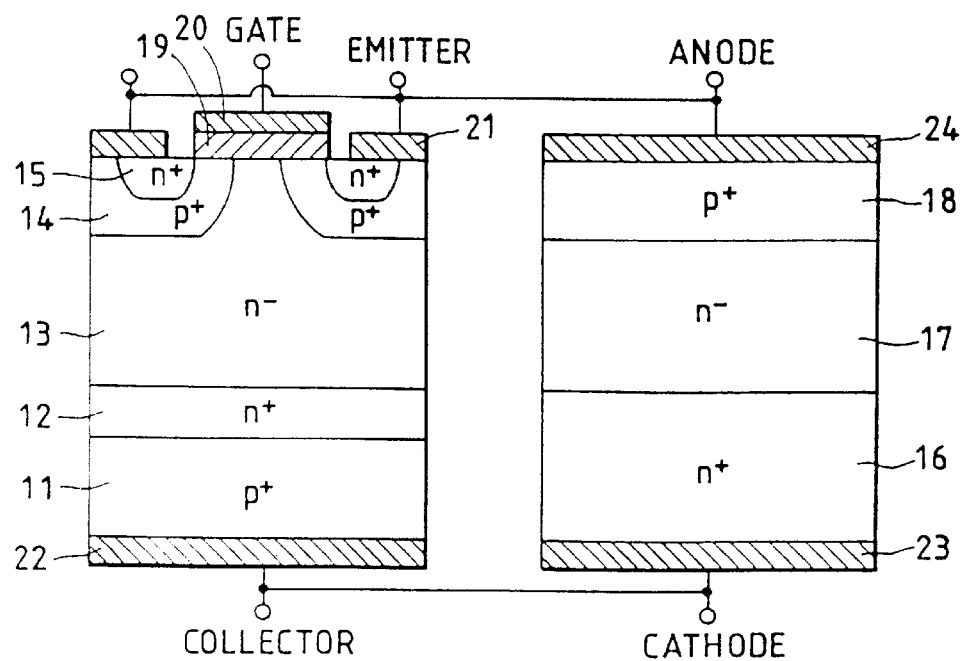
FIG. 2 is a sectional view of the IGBT and the diode in the IGBT module.

FIG. 2 shows a cross sectional structure of the module and the connecting arrangement of both IGBT 1 and diode 2.

First of all, the structure of the IGBT will be described. On a p+ silicon substrate 11, there is formed an n+ layer 12 whose impurity concentration is lower than the p+ substrate, and then an n− layer 13 whose impurity concentration is lower than the n+ layer 12 is formed on the n+ layer. P+ layer 14 with higher impurity concentration is formed selectively on the surface of the n− layer 13, and then the n+ layer 15 whose impurity concentration is higher than the p+ layer 14 is formed selectively on the surface of p+ layer 14 area. Counter portions of the surface parts of the p+ layer 14, sandwiched by the n− layer 13 and the n+ layer 15, are formed as a channel area. A gate insulation film 19 is formed on this channel area. In addition, a gate electrode 20 is formed on insulation film 19. In addition, an emitter electrode 21 is connected together to the p+ layer 14 and the n+ layer 15 and a collector electrode 22 is connected to the p+ silicon substrate 11.

Now, structure of the diode will be explained. An n− layer 17 with low impurity concentration is formed on an n+ substrate 16, and a p+ layer 18 with high impurity concentration is formed on the surface part of an n− layer 17. Cathode electrode 23 is connected to the n+ substrate 16, and anode electrode 24 is connected to the p+ layer 18. The resistivity of the n− layer 17 of the diode is lower than that of the n− layer 13 of the IGBT.

The collector electrode 22 of the IGBT is connected to the cathode electrode 23 of the diode, and the emitter electrode 21 of the IGBT is connected to the anode electrode 24 of the diode. So, the IGBT and the diode are connected in the opposite direction in parallel with each other.

Turnoff of the IGBT and the tail electric current will be explained. When the IGBT is turned off, a reverse bias is applied between the n− layer 13 and the p+ layer 14. As a result, a depletion layer is extended in the n− layer 13 with low resistivity. The depletion layer supports the voltage applied to the device. This time, the higher the resistivity of the n− layer is, the more easily the depletion layer extends. When the depletion layer extends, holes accumulated in the n− layer 13 and n+ layer 12 recombine with electrons and disappear. The electric current that flows until the holes disappear is the tail electric current.

Figure 7:
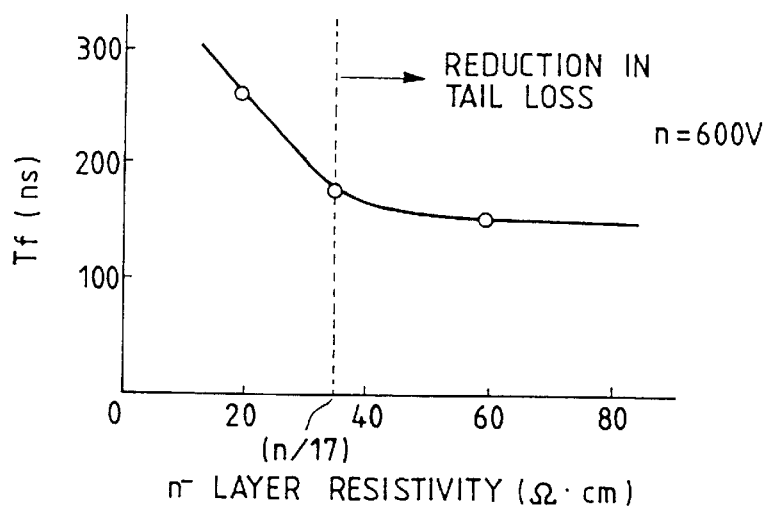
FIG. 7 is a graph showing the relationship between resistivity of n– layer of IGBT and fall time (Tf).

FIG. 7 shows the relationship between resistivity and fall time (Tf) in the n− layer 13 in an IGBT of which the rated voltage is 600 V. When the resistivity of n− layer 13 is large, the depletion layer extends easily upon turnoff and the amount of holes accumulated in the n− layer 13 is not large, so that almost no tail electric current flows. Therefore, in this case, the fall time becomes shorter. When the resistivity of the n− layer 13 is small, plenty of holes are accumulated in the n− layer 13, and the depletion layer does not extend easily. Thus, a tail electric current flows. In this case, the time becomes longer, and the loss of the IGBT increases. Therefore, the loss at the time of turnoff is reduced as the resistivity of the n− layer 13 of the IGBT is higher.

According to the result of examination of this phenomenon by the inventors, when a rated voltage is nV, it is found that it is desirable to set the resistivity of the n− layer 13 in the IGBT to be more than n/17 Ω·cm.

Figure 11:
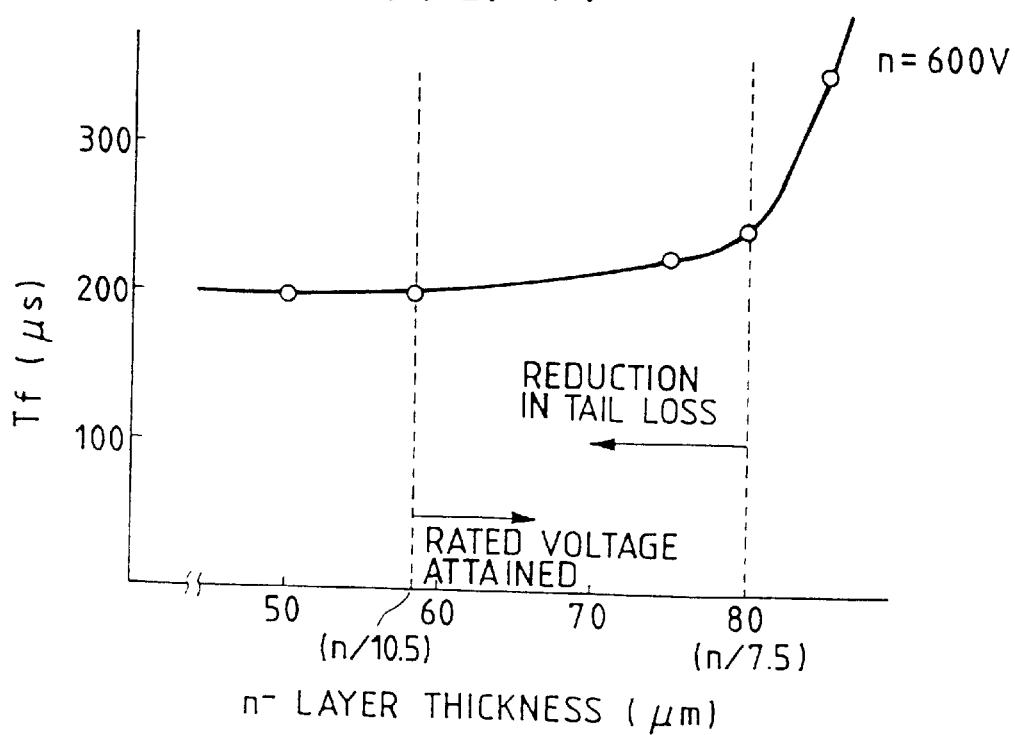
FIG. 11 is a graph showing the relationship between resistivity of n– layer 13 and fall time (Tf) in IGBT.

FIG. 11 shows the relationship between the thickness of the n− layer 13 and the fall time (Tf) in an IGBT of which the rated voltage is 600 v. When the n− layer 13 in the IGBT is thin, as the depletion layer fully extends throughout the n− layer when turnoff occurs, almost no tail electric current flows, and the value of the fall time becomes almost constant. When the n− layer 13 in the IGBT is thick, as the depletion layer extends, not enough tail electric current flows, and the fall time becomes longer. With an increase in the thickness of the n− layer 13, the loss of the IGBT increases. In order to secure a static breakdown voltage higher than the rated voltage, a certain thickness is necessary. Therefore, in the IGBT, the thickness of the n− layer 13 should be in a range that is necessary to secure a static breakdown voltage higher than the rated voltage, and the thickness should be such that the loss due to tail current is reduced. According to the result of examination by the inventors, when the rated voltage is set to nV, it is desirable that the thickness of n− layer 13 in the IGBT is in the range of (n/10.5)–(n/7.5) μm.

Figure 6:
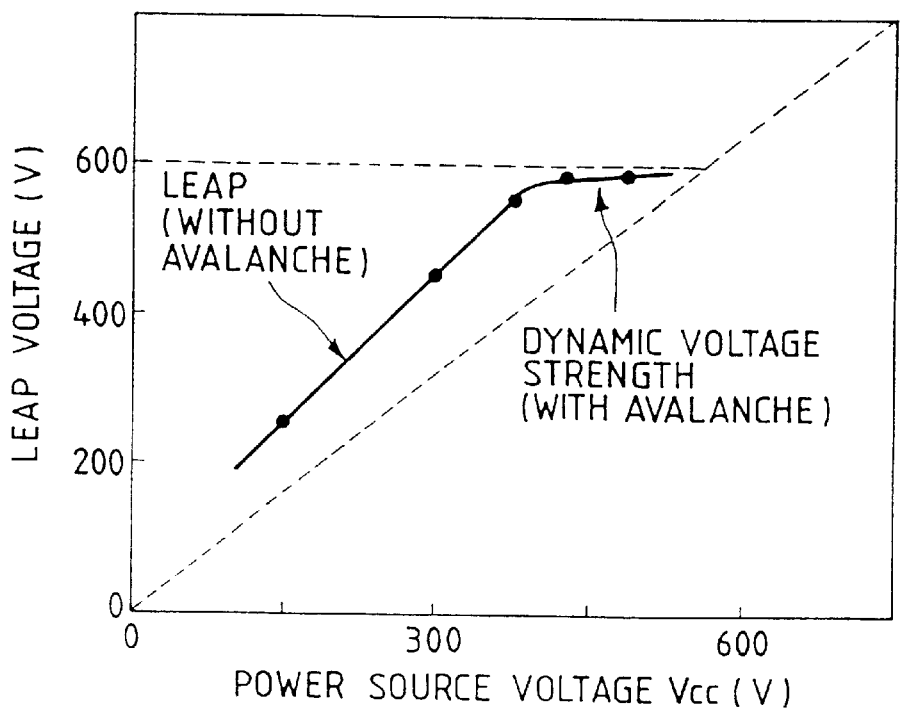
FIG. 6 is a characteristic diagram which shows the change of the leap voltage when the power voltage is changed.

Here, the dynamic break down voltage of the IGBT will be explained. FIG. 6 shows a relationship between the power voltage and the leap voltage at the time of turnoff of the IGBT. The resistivity of the n− layer 13 of the IGBT is 40 Ω·cm. The inventors found that, when the power voltage is low, the leap voltage increases with increase of the power voltage, but when the power voltage reaches over 300 V, the increase of leap voltage almost stops. The reason why the above phenomenon occurs is that when the power voltage becomes high, avalanche breakdown occurs in the active area of the IGBT. Generally, avalanche breakdown occurs in the termination area in the blocking state, and occurrence of avalanche breakdown determines the breakdown voltage. This breakdown voltage is called a static breakdown voltage. But, in the conductive state, the resistivity of the n– layer 13 in the IGBT becomes lower, because of conductivity modulation. Therefore, at the time of turnoff, the depletion layer does not extend more easily than at the time of the state of blocking. The voltage that is applied to the depletion layer becomes larger, and therefore, in the blocking voltage of the termination area, that is a voltage lower than the static breakdown voltage, avalanche breakdown occurs in the active area so as to keep the leap voltage constant. The voltage is called a dynamic breakdown voltage at which avalanche breakdown occurs at the time of turnoff. The inventors discovered that the dynamic breakdown voltage exceeded the static breakdown voltage, when the dynamic breakdown strength becomes higher with the increase of the resistivity in the n– layer 13, and the resistivity in the n– layer 13 is enlarged to reduce the tail electric current.

When the dynamic breakdown voltage is lower than the static breakdown voltage of the diode or the IGBT, electric currents disperse in the whole active area of the IGBT, and its breakdown capability becomes higher. Thus, IGBT modules are not damaged, even if avalanche breakdown occurs in the dynamic breakdown voltage of the IGBT. When the dynamic breakdown voltage of the IGBT is higher than the static breakdown voltage of the diode and the IGBT at the time of turnoff, a voltage that is higher than the static breakdown voltage is applied to the IGBT or the diode through the leap voltage. There is a fear that the IGBT, the diode or the IGBT modules may be destroyed by the over-voltage. Therefore, the diode can be protected from the leap voltage at the time of turnoff by setting the dynamic breakdown voltage of the IGBT lower than the static breakdown voltage of the IGBT or the diode.

According to a test result, when the rated voltage is set as nV, it is desirable that the resistivity of the n– layer 13 of the IGBT should be (n/6)Ω·cm or less.

As mentioned above, the invention is effective to reduce the turn-off loss of the IGBT modules and improve the destruction capability by the following measures.

(1) Resistivity of the n– layer 13 in the IGBT is increased.

(2) n– layer 13 is made thinner in the range that the rated voltage is secured.

(3) The dynamic breakdown voltage of the IGBT should be lower than the static breakdown voltage of the IGBT or the diode.

In IGBT modules, a leap voltage and noise are generated by recovery of the diode at the time of turn-on. To reduce these, it is necessary to reduce the electric current changing rate when the diode is recovering. The tail electric current of the IGBT is a recombination current, but the recovery electric current of the diode is determined by diffusion current. In the case of the diode, the electric current changing rate of the IGBT becomes smaller when the resistivity of the n– layer is kept lower. That is, in the low resistivity of the n– layer, the depletion layer hardly extends at the time of recovery of the diode, and therefore, sweeping out of the carriers occurs slowly.

Figure 8:
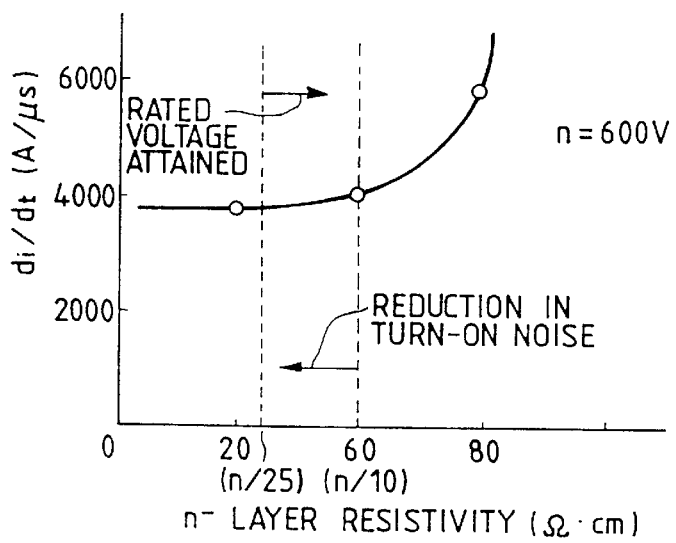
FIG. 8 is a graph showing the relationship between resistivity of n– layer 17 and electric current changing rate (di/dt).

FIG. 8 shows the relationship between the resistivity of the n– layer 17 and electric current changing rate (di/dt) when recovering the diode by turn-on, where the rated voltage of the diode is 600 V. When the resistivity of the n– layer 17 of the diode is low, as the depletion layer does not extend enough, sweeping out of the carriers occurs slowly. As a result, the electric current changing rate is suppressed to a low level. But, when the resistivity of the n– layer 17 becomes high, sweeping out of the carriers becomes fast, and the electric current changing rate also increases with the increase of resistivity. Therefore, a lower resistivity of the n– layer 17 in the diode is better. However, when the resistivity is lowered too much, the static breakdown voltage may also be reduced. Therefore, it is desirable that the resistivity of the n– layer 17 in the diode should be set low, in the range that the static breakdown voltage can be higher than the rated voltage.

According to the result of examination by the inventors, when the rated voltage is set to nV, it is desirable that the resistivity of the n– layer 17 of the diode should be in the range of (n/25)–(n/10)Ω·cm.

Figure 10:
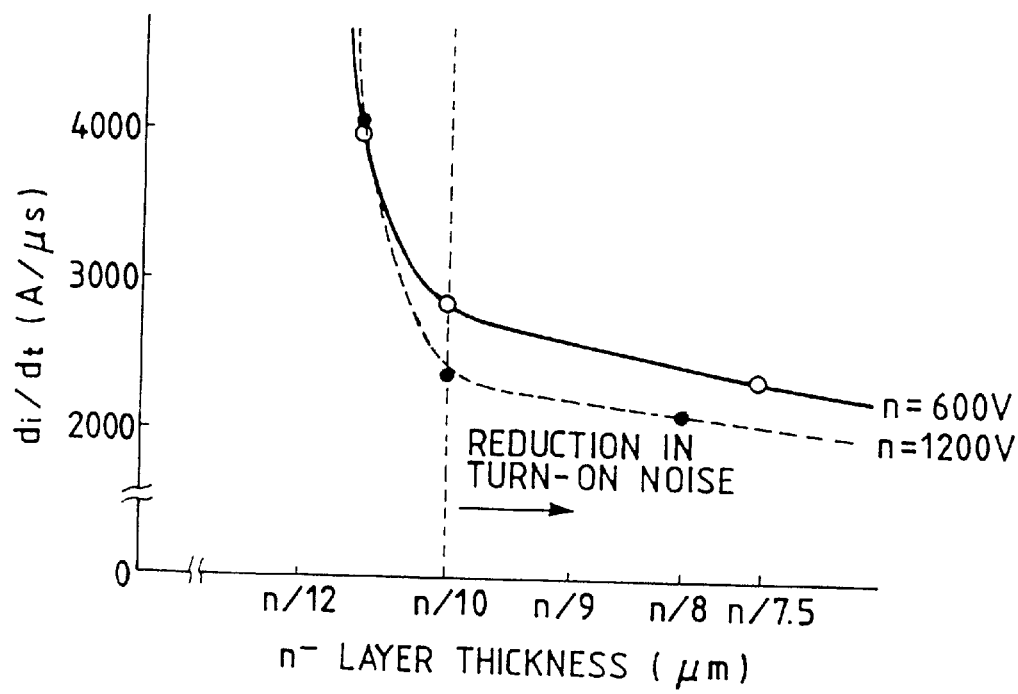
FIG. 10 is a graph showing the relationship between resistivity of n– layer 17 and electric current changing rate (di/dt).

FIG. 10 shows the relationship between the thickness of the n– layer 17 and the electric current changing rate (di/dt), when the diode recovers by turn-on, the rated voltage of the diode being 600 V. When the n– layer 17 is thick, the effect is the same as when the resistivity value is low. That is, because the depletion layer is not extended enough at the time of recovery, the carriers are swept out slowly. Therefore, the electric current changing rate could be suppressed. When the n– layer 17 is thin, the electric current changing rate becomes larger. Therefore, the thickness of the n– layer 17 of the diode should be made large.

Therefore, in order to reduce the leap voltage and the noise at the time of turn-on, the resistivity of the n– layer 17 in the diode should be kept low, as long as the rated voltage is attained. The n– layer 17 should be made thicker. According to the test result from the inventors, when the rated voltage is set to be nV, it is desirable that the thickness of n– layer 17 of the diode is set to (n/10) μm.

The inventors found that it is possible to reduce turn-on loss, to secure high breakdown voltage and to reduce turn-on noise by the following measures.

(1) Resistivity of the n– layer 17 in the diode is made lower than the resistivity of the n– layer 13 in the IGBT.

(2) Thickness of the n– layer 13 of the IGBT is made thinner than that of the n– layer 17 of the diode.

(3) Static breakdown voltage of the IGBT and the diode are made not higher than the dynamic breakdown voltage in the IGBT.

In the above, it is suggested that the IGBT and the diode have a rated voltage of 600 V or 1200 V. Generally, the way that the depletion layer extends is decided by the applied voltage and resistivity (impurity concentration). More in detail, the width of the depletion layer is proportional to ½ square of the applied voltage and ½ square of the inverse number of the impurity concentration. Therefore, even in another case of the rated voltage, the relationship among the extension of the depletion layer and the resistivity is the same as that in the case of 600 V and 1200 V rated voltage.

Figure 9:
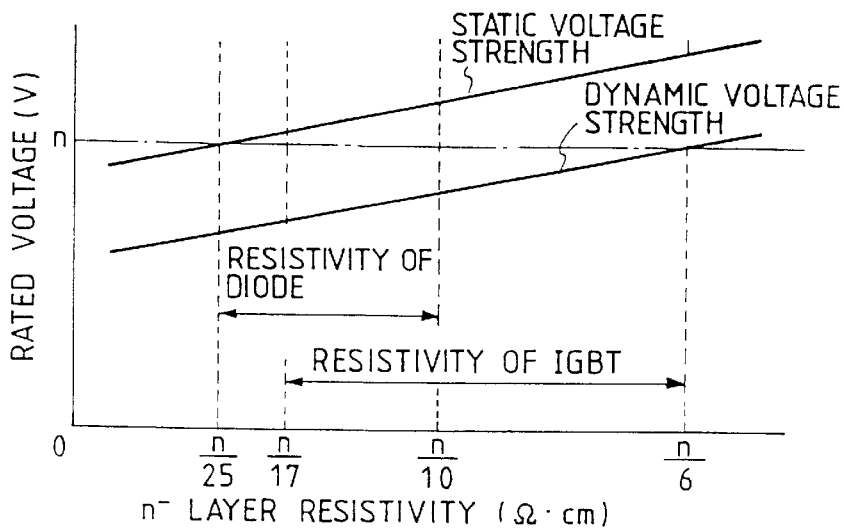
FIG. 9 is a graph showing the relationship between resistivity of n– layer of IGBT and diode and a rated voltage.

FIG. 9 shows the relation between the resistivity and the voltage of the n– layer in the IGBT and the diode, when the rated voltage is nV. The resistivity of the n– layer in the diode is lower than the resistivity of the n– layer in the IGBT, so the resistivity is in a range where the dynamic breakdown voltage becomes lower than the static breakdown voltage of the diode. The static breakdown voltage of the diode is in a range which is higher than the rated voltage. According to the results of the inventors experiments, when the rated voltage of the IGBT module is set to nV, the ranges that fulfill the above relations are described as follows.

(I) Resistivity of the n– layer 13 of the IGBT: (n/17)–(n/6) Ω·cm.

(II) Resistivity of the n– layer 17 of the diode: (n/25)–(n/10)Ω·cm.

(III) Thickness of the n– layer 13 in the IGBT: (n/10.5)–(n/7.5) μm.

(IV) Thickness of the n– layer 17 in the diode: (n/10) μm or more.

In the IGBT modules which comprise the IGBT and the diode having a resistivity and a thickness in the range mentioned above, the maximum leap voltage is suppressed, and it has been confirmed through experiment that the occurrence of noise was suppressed.

A thickness of n– layer 17 in the diode which is 1.2 times or more than that of the n– layer 13 of the IGBT is preferable.

The resistivity of the base layer in the diode is set lower than the resistivity of the base layer on the collector side of the IGBT. The IGBT module having a circuit in a reverse parallel connection with low noise and small loss could be obtained by setting the dynamic breakdown voltage of the IGBT lower than the static breakdown voltage of the diode and the IGBT.

What is claimed is:

1. An inverter apparatus comprising:
   a plurality of semiconductor devices connected in series in one phase, at least one of the semiconductor devices being constituted by a pair consisting of an insulated gate bipolar transistor and a diode, both of which are in a reverse parallel connection;
   wherein the resistivity of a base layer of lowest impurity concentration in said diode is lower than that of a base layer of lowest impurity concentration in said insulated gate bipolar transistor; and
   wherein the breakdown voltage of said insulated gate bipolar transistor at the time of switching from a conduction state to a blocking state is lower than the breakdown voltage of said insulated gate bipolar transistor and the breakdown voltage of said diode at the time of said blocking state.

2. The inverter apparatus according to claim 1, wherein, in each of the semiconductor devices, said base layer of lowest impurity concentration in said diode is thicker than said base layer of lowest impurity concentration in said insulated gate bipolar transistor.

3. The inverter apparatus according to claim 1, wherein, in each of the semiconductor devices, said base layer in said insulated gate bipolar transistor has such resistivity and thickness that a depletion layer is formed at about (n/2) volts, but the base layer of said diode has such resistivity and thickness that the depletion layer is not formed at (n/2) volts, where a rated voltage is n volts.

4. The inverter apparatus according to claim 1, wherein, in each of the semiconductor devices, the resistivity of said base layer in said insulated gate bipolar transistor is in the range of (n/17) to (n/6) Ω·cm and the resistivity of said base layer of said diode is in the range of (n/25) to (n/17) Ω·cm, where a rated voltage is n volts.

5. The inverter apparatus according to claim 1, wherein, each of the semiconductor devices, a thickness of said base layer of said insulated gate bipolar transistor is in the range from (n/10.5) to (n/7.5) μm and a thickness of said base layer in said diode is (n/10) μm or more, where a rated voltage is n volts.

6. An inverter apparatus comprising:
   a plurality of semiconductor devices connected in series in one phase, at least one of the semiconductor devices being constituted by a pair consisting of an insulated gate bipolar transistor and a diode, both of which are in a reverse parallel connection in a module;
   wherein the resistivity of a base layer of lowest impurity concentration in said diode is lower than that of a base layer of lowest impurity concentration in said insulated gate bipolar transistor; and
   wherein the breakdown voltage of said insulated gate bipolar transistor at the time of switching from a conduction state to a blocking state is lower than the breakdown voltage of said insulated gate bipolar transistor and the breakdown voltage of said diode at the time of said blocking state.

7. The inverter apparatus according to claim 6, wherein, in each of the semiconductor devices, said base layer of lowest impurity concentration in said diode is thicker than said base layer of lowest impurity concentration in said insulated gate bipolar transistor.

8. The inverter apparatus according to claim 6, wherein, in each of the semiconductor devices, said base layer in said insulated gate bipolar transistor has such resistivity and thickness that a depletion layer is formed at about (n/2) volts, but the base layer of said diode has such resistivity and thickness that the depletion layer is not formed at (n/2) volts, where a rated voltage is n volts.

9. The inverter apparatus according to claim 6, wherein, in each of the semiconductor devices, the resistivity of said base layer in said insulated gate bipolar transistor is in the range of (n/17) to (n/6) Ω·cm and the resistivity of said base layer of said diode is in the range of (n/25) to (n/17) Ω·cm, where a rated voltage is n volts.

10. The inverter apparatus according to claim 6, wherein, in each of the semiconductor devices, a thickness of said base layer of said insulated gate bipolar transistor is in the range from (n/10.5) to (n/7.5) μm and a thickness of said base layer in said diode is (n/10) μm or more, where a rated voltage is n volts.

11. An inverter apparatus comprising:
    a plurality of semiconductor devices connected in series in one phase, at least one of the semiconductor devices being constituted by a pair consisting of an insulated gate bipolar transistor and a diode, both of which are in a reverse parallel connection;
    wherein the resistivity of a base layer of lowest impurity concentration in said insulated gate bipolar transistor is in the range from (n/17) to (n/6) Ω·cm, and the resistivity of a base layer of lowest impurity concentration in said diode is in the range of (n/25) to (n/17) Ω·cm; and
    wherein the thickness of said base layer of said insulated gate bipolar transistor is from (n/10.5) to (n/7.5) μm, and the thickness of said base layer of said diode is (n/10) μm or more, where n is a rated voltage expressed in volts.

12. An inverter apparatus comprising:
    a plurality of semiconductor devices connected in series in one phase, at least one of the semiconductor devices being constituted by a pair consisting of an insulated gate bipolar transistor and a diode, wherein
    (1) said insulated gate bipolar transistor comprises:
        a first main surface and a second main surface;
        a first area of a first conductive type, exposed to said first main surface;
        a second area of a second conductive type, adjacent to said first area and having an impurity concentration lower than that of said first area;

a third area of the second conductive type, adjacent to said second area and having an impurity concentration lower than that of said second area and being exposed to the second main surface;

a fourth area of the first conductive type selectively formed in said second main surface and having an impurity concentration higher than that of said third area;

a fifth area of the second conductive type, selectively formed in the second main surface and having an impurity concentration higher than that of said fourth area, an insulated gate being formed on the third, fourth and fifth areas through an insulation film;

a first main electrode in low ohmic contact with the first area; and a second main electrode which shorts said fourth and fifth areas on the second main surface; and (2) said diode has one and other main surfaces and comprises:

a sixth area of the second conductive type, exposed to said one main surface;

a seventh area of the second conductive type adjacent to said sixth area and having an impurity concentration lower than that of said sixth area;

an eighth area of the first conductive type, adjacent to said seventh area and having an impurity concentration which is higher than that of said seventh area and being exposed to said other main surface;

a third main electrode in low ohmic contact with said sixth area; and a fourth main electrode in low ohmic contact with said eighth area;

wherein said first main electrode and said third main electrode are connected to each other, and said second main electrode and said fourth main electrode are connected to each other;

wherein the resistivity of the seventh area in said diode is lower than that of the third area of said insulated gate bipolar transistor; and wherein the breakdown voltage of the insulated gate bipolar transistor at the time of switching from a conduction state to a blocking state is lower than the breakdown voltage of said insulated gate bipolar transistor and the breakdown voltage of said diode at the time of said blocking state.

13. The inverter apparatus according to claim 12, wherein, in each of the semiconductor devices, the thickness of the seventh area of said diode is larger than that of the third area of said insulated gate bipolar transistor.

14. The inverter apparatus according to claim 12, wherein, in each of the semiconductor devices, the third area in said insulated gate bipolar transistor has such resistivity and thickness that a depletion layer is formed at (n/2) volts, and the seventh area in said diode has such resistivity and thickness that a depletion layer is not formed at (n/2) volts, where a rated voltage is n volts.

15. The inverter apparatus according to claim 12, wherein, in each of the semiconductor devices, the resistivity of the third area in said insulated gate bipolar transistor is in the range of n/17 to n/6 $\Omega \cdot$cm, and the resistivity of the seventh area in said diode is in the range from n/25 to n/17 $\Omega \cdot$cm, where a rated voltage is n volts.

16. The inverter apparatus according to claim 12, wherein, in each of the semiconductor devices, the thickness of the third area in said insulated gate bipolar transistor is from n/10.5 to n/7.5 $\mu$m, and the thickness of the seventh area in said diode is n/10 $\mu$m or more, where a rated voltage is n volts.

17. An inverter apparatus comprising a plurality of semiconductor devices connected in series in one phase, at least one of the semiconductor devices being constituted by a pair consisting of an insulated gate bipolar transistor and a diode, both of which are in reverse parallel connection in one module, wherein (1) said insulated gate bipolar transistor comprises:

a first area of a first conductive type, exposed to a first main surface;

a second area of a second conductive type, adjacent to said first area and having an impurity concentration lower than that of said first area;

a third area of the second conductive type, adjacent to said second area and having an impurity concentration lower than that of said second area and having a surface exposed to a second main surface;

a fourth area of the first conductive type, selectively formed in said second main surface in said third area and having an impurity concentration higher than that of said third area;

a fifth area of the second conductive type, selectively formed in the second main surface in said fourth area and having an impurity concentration higher than that of said fourth area;

a first main electrode in low ohmic contact with the first area; and a second main electrode short-circuiting said fourth and fifth areas on the second main surface; and (2) said diode has one main surface and other main surface and comprises:

a sixth area of the second conductive type, exposed to the one main surface;

a seventh area of the second conductive type, adjacent to said sixth area and having an impurity concentration lower than that of said sixth area;

an eighth area of the first conductive type, adjacent to said seventh area and having an impurity concentration higher than that of said seventh area;

a third main electrode in low ohmic contact with the sixth area; and a fourth main electrode in low ohmic contact with said eighth area;

wherein said first and third main electrodes are connected to each other, and said second and fourth main electrodes are connected to each other;

wherein the resistivity of the seventh area in said diode is lower than that of the third area of said insulated gate bipolar transistor; and wherein the breakdown voltage of the insulated gate bipolar transistor at the time of switching from a conduction state to a blocking state is lower than the breakdown voltage of said insulated gate bipolar transistor and the breakdown voltage of said diode at the time of the blocking state.

18. The inverter apparatus according to claim 17, wherein, in each of the semiconductor devices, the thickness of the seventh area of said diode is larger than that of the third area of said insulated gate bipolar transistor.

19. The inverter apparatus according to claim 17, wherein, in each of the semiconductor devices, the third area in said insulated gate bipolar transistor has such resistivity and thickness that a depletion layer is formed at (n/2) volts, and the seventh area in said diode has such resistivity and thickness that a depletion layer is not formed at (n/2) volts, where a rated voltage is n volts.

20. The inverter apparatus according to claim 17, wherein, in each of the semiconductor devices, the resistivity of the third area in said insulated gate bipolar transistor is in the range of n/17 to n/6 Ω·cm, and the resistivity of the seventh area in said diode is in the range from n/25 to n/17 Ω·cm, where a rated voltage is n volts.

21. The inverter apparatus according to claim 17, wherein, in each of the semiconductor devices, the thickness of the third area in said insulated gate bipolar transistor is from n/10.5 to n/7.5 μm, and the thickness of the seventh area in said diode is n/10 μm or more, where a rated voltage is n volts.

22. An inverter apparatus comprising:
a plurality of semiconductor devices connected in series in one phase, at least one of the semiconductor devices being constituted by
(1) an insulated gate bipolar transistor having a semiconductor body with a first main surface and a second main surface;
a first area of first conductive type, exposed to said first main surface;
a second area of second conductive type, adjacent to said first area and having an impurity concentration lower than that of said first area;
a third area of the second conductive type, adjacent to said second area and having an impurity concentration lower than the second area;
a fourth area of the first conductive type, selectively formed in said third area and having an impurity concentration higher than that of said third area;
a fifth area of the second conductive type, selectively formed in said fourth area and having an impurity concentration higher than that of said fourth area;
a first main electrode in low ohmic contact with the first area;
a second main electrode which shorts said fourth and fifth areas on the second main surface;
an insulated gate formed on said third, fourth and fifth areas, exposed to said second main surface, through an insulation film; and
(2) a diode having a semiconductor body with one main surface and other main surface;
a sixth area of the second conductive type, exposed to the one main surface;
a seventh area of the second conductive type, adjacent to said sixth area and having an impurity concentration lower than that of said sixth area;
an eighth area of the first conductive type, adjacent to said seventh area and having an impurity concentration higher than that of said seventh area;
a third main electrode in low ohmic contact with said sixth area; and
a fourth main electrode in low ohmic contact with said eighth area;
wherein said first and said third main electrodes are connected to each other, and said second and said fourth main electrodes are connected to each other; wherein the resistivity of the third area of said insulated gate bipolar transistor is in the range from n/17 to n/6 Ω·cm, and the resistivity of the seventh area of said diode is in the range from n/25 to n/17 Ω·cm; wherein the thickness of the third area of said insulated gate bipolar transistor is in the range from n/10.5 to n/7.5 μm; and wherein the thickness of the seventh area in said diode is n/10 μm or more, where n is a rated voltage expressed in volts.

* * * * *